US008625291B2

(12) United States Patent
Yu et al.

(10) Patent No.: US 8,625,291 B2
(45) Date of Patent: Jan. 7, 2014

(54) ELECTRONIC DEVICE FOR MINIATURIZING SIZE THEREOF

(75) Inventors: Yong-Jun Yu, Shenzhen (CN); Na Wang, Shenzhen (CN); Bao-Gang Zhao, Shenzhen (CN); Wei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 137 days.

(21) Appl. No.: 13/171,634

(22) Filed: Jun. 29, 2011

(65) Prior Publication Data

US 2012/0092840 A1 Apr. 19, 2012

(30) Foreign Application Priority Data

Oct. 13, 2010 (CN) .......................... 2010 1 0505756

(51) Int. Cl.
*H05K 5/00* (2006.01)
*H05K 7/00* (2006.01)

(52) U.S. Cl.
USPC .............................. 361/752; 361/748; 174/59

(58) Field of Classification Search
USPC ........... 174/50, 50.52, 59; 361/810, 752, 807, 361/679.01, 600, 748, 753, 760, 761; 349/58
See application file for complete search history.

(56) References Cited

U.S. PATENT DOCUMENTS

| | | | | |
|---|---|---|---|---|
| 5,193,022 | A * | 3/1993 | Hirai | 349/150 |
| 5,729,316 | A * | 3/1998 | Yamamura et al. | 349/150 |
| 6,020,867 | A * | 2/2000 | Shimada et al. | 345/87 |
| 6,172,731 | B1 * | 1/2001 | Nagano et al. | 349/150 |
| 7,242,575 | B2 * | 7/2007 | Zhang et al. | 361/679.21 |
| 7,432,998 | B2 * | 10/2008 | Nishio et al. | 349/58 |
| 7,751,015 | B2 * | 7/2010 | Murakami | 349/150 |
| 8,047,668 | B2 * | 11/2011 | Chang et al. | 362/97.1 |
| 2010/0208144 | A1 * | 8/2010 | Yoshikawa | 348/725 |

* cited by examiner

*Primary Examiner* — Jenny L Wagner
*Assistant Examiner* — Dimary Lopez
(74) *Attorney, Agent, or Firm* — Altis Law Group, Inc.

(57) ABSTRACT

An electronic device includes a main body, a display panel and an electrical circuit board assembly. The display panel is disposed in the main body and includes a power cord for supplying power to a backlight module thereof. The electrical circuit board assembly is located beneath the display panel and connected to the power cord by a connector. An accommodating space is defined between the electrical circuit board assembly and a second portion of the main body for receiving the connector therein.

16 Claims, 4 Drawing Sheets

ELECTRONIC DEVICE FOR MINIATURIZING SIZE THEREOF

BACKGROUND

1. Technical Field

The present disclosure relates to electronic devices, and particularly to an electronic device having a display panel.

2. Description of Related Art

Many display devices often include a housing for receiving a display panel and a printed circuit board (PCB) with various components for driving the display panel. The PCB is often located beneath the display panel and connected to a power cord of a backlight module of the display panel by a connector. The connector is often disposed on one side of the PCB for convenience during assembly. Therefore, for accommodating the connector, the side of the PCB should be spaced away from the housing a certain distance, which results in difficulty in miniaturization of the display device.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
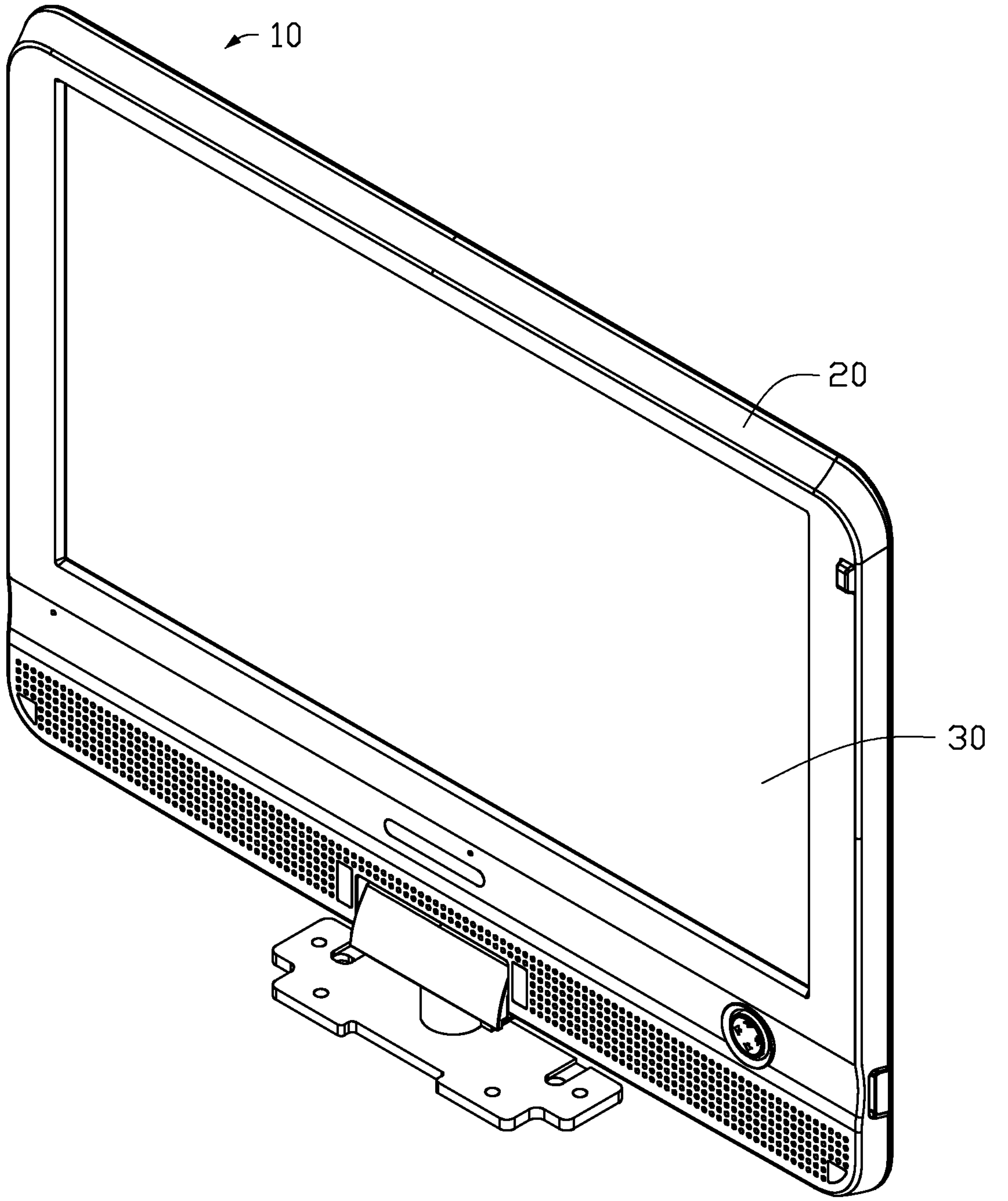
FIG. 1 is a schematic view of an electronic device according to an embodiment of the present disclosure. The electronic device includes a display panel, an electrical circuit board assembly, and a connector.
Figure 2:
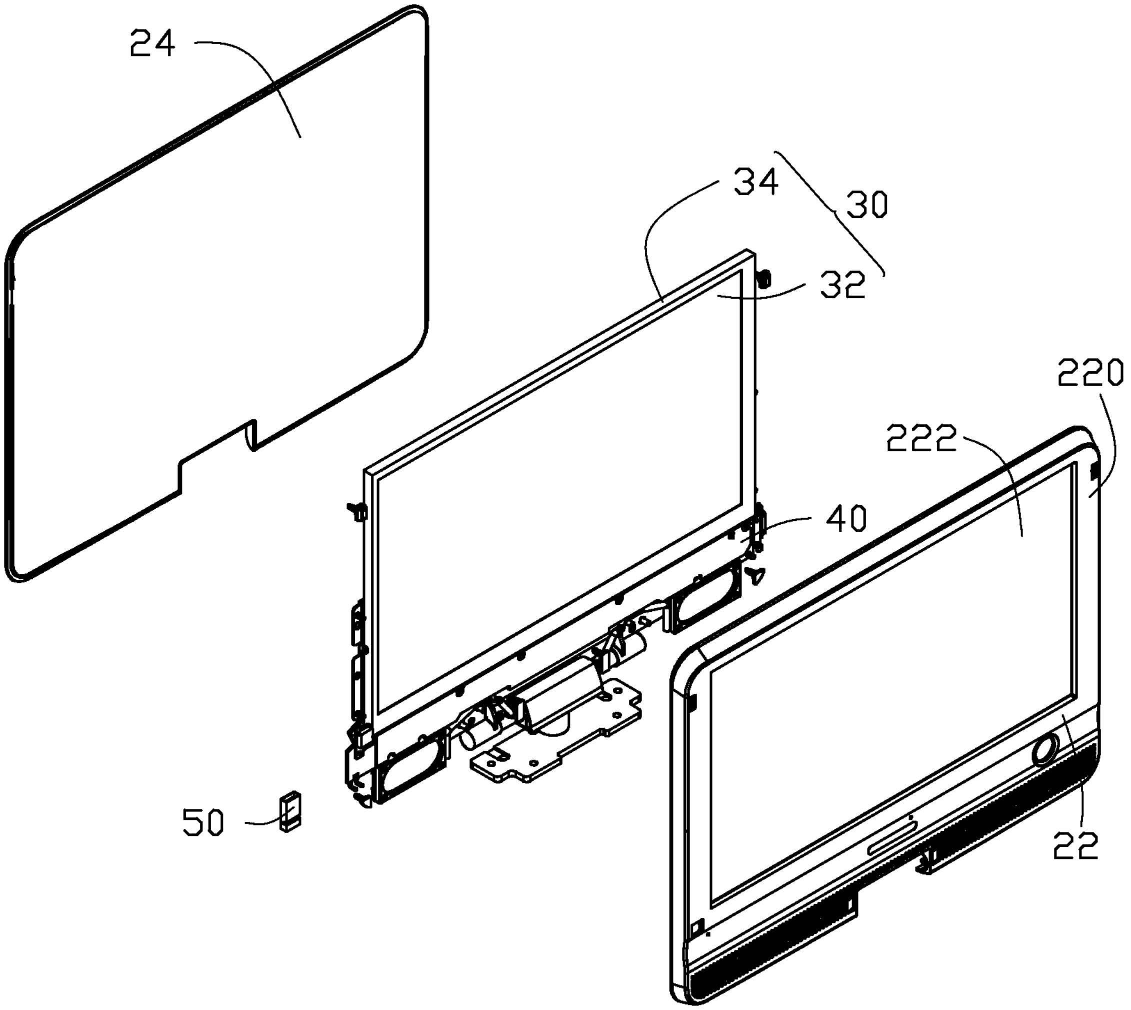
FIG. 2 is an exploded view of the electronic device of FIG. 1.

Referring to FIGS. 1 and 2, an electronic device 10 includes a main body 20, a display panel 30, an electrical circuit board assembly 40, and a connector 50. The main body 20 is used for receiving various components for operating the electronic device 10. In some embodiments, the electronic device 10 may be a display device. The connector 50 electrically connects the electrical circuit board assembly 40 with the display panel 30.

The main body 20 includes a first portion 22 and a second portion 24 engaged with the first portion 22. The first portion 22 includes a base plate 220. A through hole 222 is defined in the base plate 220. In the illustrate embodiment, the second portion 24 is a substantially rectangle plate.

Figure 3:
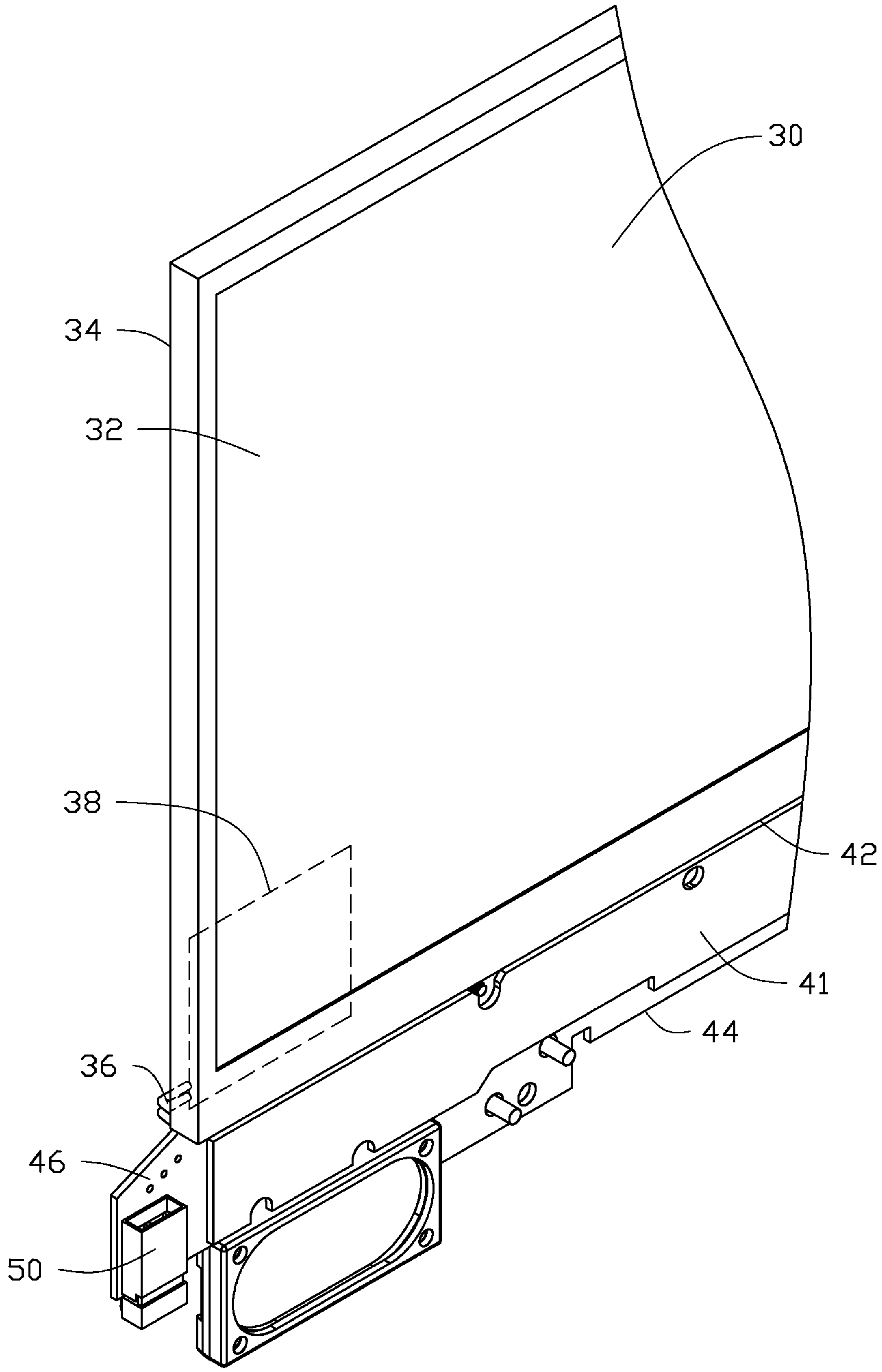
FIG. 3 is a schematic view showing the engagement between the display panel, the electrical circuit board assembly, and the connector of FIG. 1.

The display panel 30 is received in the main body 20. The display panel 30 includes a first side surface 32 corresponding to the through hole 222 and a second side surface 34 opposite to the first side surface 32. As shown in FIG. 3, the display panel 30 also has a power cord 36 for supplying power to the backlight module 38 thereof. The power cord 36 extends from the second side surface 34 to the first side surface 32.

The electrical circuit board assembly 40 is used for driving the display panel 30. The electrical circuit board assembly 40 includes an elongated printed circuit board (PCB) 41 and a plurality of components (not shown) disposed on the PCB 41.

Figure 4:
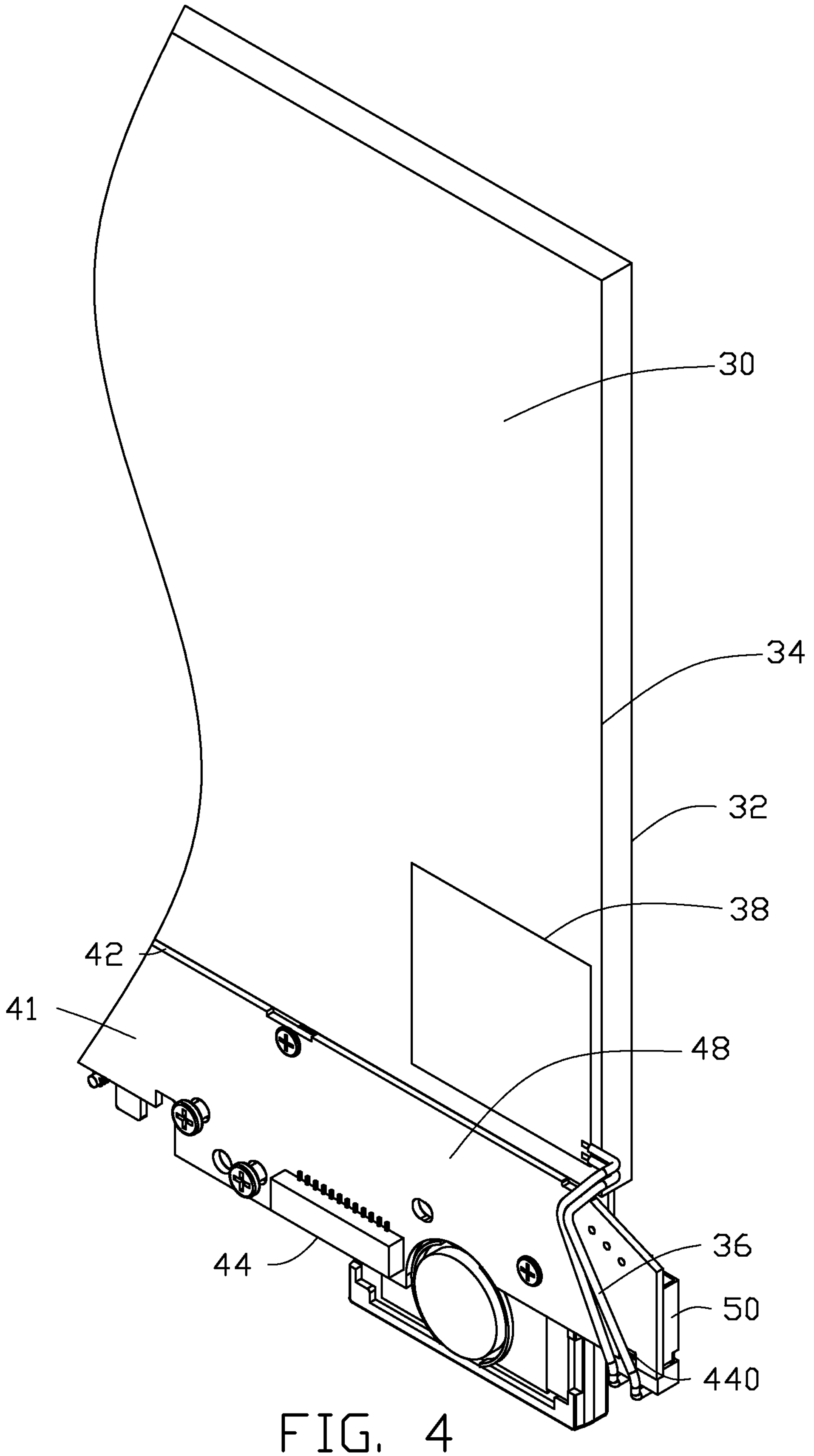
FIG. 4 is similar to FIG. 3 but from another angle.

The PCB 41 has a first edge 42, a second edge 44 opposite to the first edge 42, a first connecting surface 46 and a second connecting surface 48 opposite to the first connecting surface 46 as shown in FIG. 4. A slot 440 is defined in the PCB 41 and adjacent to the second edge 44. In the embodiment, the thickness of the PCB 41 is smaller than that of the display panel 30 along a direction perpendicular to the first connecting surface 46.

When the display panel 30 is mounted to the first portion 22, the first side surface 32 contacts an interior surface of the base plate 220 of the first portion 22. The connector 50 and other components of the electrical circuit board assembly 40 are mounted on the first connecting surface 46 of the PCB 41. The connector 50 at this point corresponds to the slot 440. When the electrical circuit board assembly 40 and the connector 50 are mounted to the display panel 30, the first side edge 42 of the PCB contacts the display panel 30. While the second connecting surface is coplanar with the second side surface 34 of the display panel 30 and the first connecting surface 46 is spaced apart from the interior surface of the base plate 220 to define an accommodating space, where components of the electrical circuit board assembly 40 and the connector 50 are received. The power cord 36 contacts the second connecting surface 48 and is connected to the connector 50. When the second portion 24 is mounted to the first portion 22, both the second side surface 34 of the display panel 30 and the second connecting surface 48 of the PCB 41 contact the second portion 24.

It should be noted that during the assembly process, users can check whether the connector 50 has been connected to the PCB stably via the slot 440.

With the connector 50 disposed on the first connecting surface 46 and received in the accommodating space defined between the first connecting surface 46 and the first portion 22, the second connecting surface 48 can contact the main body 20. Therefore, a space defined between the second connecting surface 48 and the second portion 24 for accommodating the connector 50 can be omitted. The size of the main body 20 thus can be decreased somewhat, which is beneficial to the miniaturization of the electronic device 10.

It is to be understood, however, that even though information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. An electronic device, comprising:

a main body comprising a first portion and a second portion attached to the first portion;

a display panel disposed in the main body, the display panel comprising a power cord for supplying power to a backlight module thereof;

an electrical circuit board assembly located under the display panel and comprising a printed circuit board, the printed circuit board comprising a first connecting surface facing the first portion and a second connecting surface opposite to the first connecting surface; and a connector for connecting the printed circuit board assembly with the power cord;

wherein a first side surface of the display panel contacts the first portion, the second connecting surface of the printed circuit board is coplanar with a second side surface of the display panel opposite to the first portion, an accommodating space is defined between the printed circuit board assembly and the first portion for receiving the connector therein.

2. The electronic device as claimed in claim 1, wherein a thickness of the printed circuit board is smaller than that of the display panel, and the accommodating space is defined between the printed circuit board and the first portion.

3. The electronic device as claimed in claim 1, wherein the first connecting surface is spaced apart from an interior surface of the first portion, the second connecting surface contacts an interior surface of the second portion, and the accommodating space is defined between the first connecting surface and the interior surface of the first portion.

4. The electronic device as claimed in claim 3, wherein the connector is disposed on the first connecting surface of the printed circuit board.

5. The electronic device as claimed in claim 4, wherein a slot is defined in the printed circuit board corresponding to the connector for being used to check whether the connector is connected to the electrical circuit board assembly stably.

6. The electronic device as claimed in claim 4, wherein the electrical circuit board assembly further comprises at least one component disposed on the first connecting surface.

7. The electronic device as claimed in claim 4, wherein the power cord contacts the second connecting surface to be connected to the connector.

8. The electronic device as claimed in claim 1, wherein the display panel comprises the first side surface contacting an interior surface of the first portion and the second side surface opposite to the first side surface contacting an interior surface of the second portion.

9. The electronic device as claimed in claim 8, wherein the printed circuit board comprises the first connecting surface spaced apart from the interior surface of the first portion, and the accommodating space is defined between the first connecting surface and the interior surface of the first portion.

10. The electronic device as claimed in claim 9, wherein the printed circuit board comprises the second connecting surface contacting the interior surface of the body portion.

11. The electronic device as claimed in claim 10, wherein the connector is disposed on the first connecting surface.

12. An electronic device, comprising:

a main body comprising a first portion and a second portion attached to the first portion;

a display panel disposed in the main body, the display panel comprising a power cord for supplying power to a backlight module thereof;

an electrical circuit board assembly located under the display panel; and a connector for connecting the electrical circuit board assembly with the power cord;

wherein an accommodating space is defined between the printed circuit board assembly and the first portion for receiving the connector therein; wherein the electrical circuit board assembly comprises a printed circuit board with a thickness thereof smaller than that of the display panel, the printed circuit board comprises a first connecting surface spaced apart from an interior surface of the first portion and a second connecting surface opposite to the first connecting surface contacting an interior surface of the second portion, and the accommodating space is defined between the first connecting surface and the interior surface of the first portion.

13. The electronic device as claimed in claim 12, wherein the connector is disposed on the first connecting surface of the printed circuit board.

14. The electronic device as claimed in claim 13, wherein a slot is defined in the printed circuit board corresponding to the connector for being used to check whether the connector is connected to the electrical circuit board assembly stably.

15. The electronic device as claimed in claim 13, wherein the electrical circuit board assembly further comprises at least one component disposed on the first connecting surface.

16. The electronic device as claimed in claim 13, wherein the power cord contacts the second connecting surface to be connected to the connector.

* * * * *